United States Patent
Yang

(10) Patent No.: US 8,115,194 B2
(45) Date of Patent: Feb. 14, 2012

(54) SEMICONDUCTOR DEVICE CAPABLE OF PROVIDING IDENTICAL STRAINS TO EACH CHANNEL REGION OF THE TRANSISTORS

(75) Inventor: Chin-sheng Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 398 days.

(21) Appl. No.: 12/034,939

(22) Filed: Feb. 21, 2008

(65) Prior Publication Data

US 2009/0212368 A1    Aug. 27, 2009

(51) Int. Cl.
*H01L 29/06* (2006.01)

(52) U.S. Cl. .......... 257/18; 257/E29.193; 257/368; 257/19

(58) Field of Classification Search .......... 257/E29.268, 257/E29.279, 18
See application file for complete search history.

(56) References Cited

U.S. PATENT DOCUMENTS

| 2004/0165441 A1* | 8/2004 | Chevallier ............... 365/185.11 |
| 2005/0184345 A1* | 8/2005 | Lin et al. ................... 257/375 |
| 2007/0020806 A1 | 1/2007 | Steegan et al. |
| 2009/0001413 A1* | 1/2009 | Gauthier et al. ............. 257/190 |

OTHER PUBLICATIONS

Article titled "Scalability of the Si 1-x Ge x Source/Drain Technology for the 45-nm Technology Node and Beyond" authored by Geert Eneman et al., IEEE Transactions on Electron Devices, vol. 53, No. 7, Jul. 2006 (pp. 1647-1656).

* cited by examiner

*Primary Examiner* — Marcos D. Pizarro
*Assistant Examiner* — Eva Yan Montalvo
(74) *Attorney, Agent, or Firm* — WPAT., P.C.; Justin King

(57) ABSTRACT

A semiconductor device including transistors and strain layers is provided. Each transistor includes a source region and a drain region on a substrate and a gate structure on a channel region between the source region and the drain region. Lengths of the channel regions of these transistors are the same, but at least one source or drain region has a width along a channel length direction and the width is different from widths of other source or drain regions. The strain layers include first and second strain layers embedded separately at two sides of each gate structure in the substrate. A first width of each first strain layer along the channel length direction is the same, and a second width of each second strain layer along the channel length direction is the same.

20 Claims, 6 Drawing Sheets

SEMICONDUCTOR DEVICE CAPABLE OF PROVIDING IDENTICAL STRAINS TO EACH CHANNEL REGION OF THE TRANSISTORS

BACKGROUND OF THE INVENTION

1. Field of the Invention

The present invention relates to an integrated circuit structure and a method of fabricating the same, and more particularly, to a semiconductor device and a fabricating method thereof.

2. Description of Related Art

As development in electronic device technology such as communication devices advances, the operating speed of the transistor is getting faster and faster. However, the speed range of the transistor is also limited by the moving speed of electrons and holes in silicon channels.

A method of increasing the operating speed of the transistor is to change the moving speed of electrons and holes in the channel through controlling the mechanical-stress in the channel. Taking a P-type channel metal oxide semiconductor (PMOS) as an example, in the prior art exists a technology of fabricating a source or drain region of the transistor mainly with a material such as SiGe epitaxy. Compared with the characteristics of silicon, since Ge has a larger atom volume and applies a compression stress on the channel, the holes in the source or drain region mainly constituted by SiGe may have a higher mobility and the performance of the device is thus enhanced.

The technology of fabricating the source or drain region of the transistor mainly using a material such as SiGe epitaxy includes removing a portion of a substrate where the source or drain region is predetermined to form. Afterwards, SiGe is filled back in the source or drain region by a selective area epitaxy growth process.

Nevertheless, during a typical process of fabricating a metal oxide semiconductor (MOS), due to considerations of different design requirements, usually channels of a plurality of transistors would have identical channel lengths but the source or drain regions of the transistors have different widths along a channel length direction. Hence, the method of completely filling SiGe into the portion of the substrate predetermined to form the source or drain region would generate different compression stresses in channel regions of the transistors respectively.

Further, when the predetermined portion where the source or drain regions are formed in the substrate is removed by an etching process, due to the loading effect of the etching process, if etched areas have different sizes, the larger area is usually etched faster and more deeply, and a profile thereof is oblique. Thus, strains of the transistors are even more uneven. Consequently, each of the transistors has different performance and reduces the reliability of the semiconductor device.

SUMMARY OF THE INVENTION

The present invention is directed to a semiconductor device capable of providing identical strains to each channel region of the transistors.

The present invention provides a semiconductor device including a plurality of transistors and a plurality of strain layers. Each of the transistors includes a source region and a drain region disposed on a substrate and a gate structure disposed on a channel region disposed between the source region and the drain region. The channels in the transistors have identical lengths. However, at least one source or drain region has a width along a channel length direction of the channel region different from widths of other source or drain regions along the channel length direction. The strain layers include a plurality of first strain layers and second strain layers respectively embedded at two sides of each of the gate structures in the substrate. Each of the first strain layers has an identical first width along the channel length direction and each of the second strain layers has an identical second width along the channel length direction.

According to an embodiment of the present invention, in the said semiconductor device, the first widths are equal to the second widths.

According to an embodiment of the present invention, in the said semiconductor device, the first widths are not equal to the second widths.

According to an embodiment of the present invention, in the said semiconductor device, when the transistors are N-type channel metal oxide semiconductors (NMOS), the strain layers are tensile stress layers. When the transistors are P-type channel metal oxide semiconductors (PMOS), the strain layers are compression stress layers. Each of the tensile stress layers includes a first semiconductor compound epitaxy layer, and each of the compression stress layers includes a second semiconductor compound epitaxy layer. The first semiconductor compound epitaxy layers are SiC or SiC having N-type dopant. The second semiconductor compound epitaxy layers are SiGe or SiGe having P-type dopant.

According to an embodiment of the present invention, in the said semiconductor device, at least one strain layer has a width along the channel length direction smaller than a width of one of the source or drain regions along the channel length direction.

According to an embodiment of the present invention, in the transistors of the said semiconductor device, two first source or drain regions of at least one first transistor have identical third widths along the channel length direction. Two second source or drain regions of at least one second transistor have identical fourth widths along the channel length direction. However, the third widths are not equal to the fourth widths. In addition, two third source or drain regions of at least one third transistor have a fifth width and a sixth width different from each other along the channel length direction.

The present invention further provides a semiconductor device including a substrate, a first source or drain region and a second source or drain region, a channel region, a gate structure, a first and a second strain layers. The first source or drain region and the second source or drain region are disposed in the substrate respectively. The channel region is disposed between the first source or drain region and the second source or drain region, and a direction of a channel length of the channel region is a first direction. The gate structure is disposed on the channel region. The first and the second strain layers are embedded at two sides of the gate substrate in the substrate. Projection areas projected on a surface of the substrate by the second strain layer and the second source or drain region are partially overlapped. The projection area of the second strain layer is inside that of the second source or drain region.

According to an embodiment of the present invention, in the said semiconductor device, the first source or drain region and the second source or drain region have identical widths in the first direction, and the second source or drain region further extends beyond the first direction. The first and the second strain layers have identical widths along the first direction.

According to an embodiment of the present invention, in the said semiconductor device, the second source or drain region has a width along the first direction larger than a width of the first source or drain region along the first direction. The second strain layer has a width along the first direction smaller than the width of the second source or drain region along the first direction. The first and the second strain layers have identical widths along the first direction.

According to an embodiment of the present invention, the said semiconductor device further includes a contact disposed on a portion of the second source or drain region not overlapped with the second strain layer.

According to an embodiment of the present invention, in the said semiconductor device, when the semiconductor device is an NMOS, the first and the second strain layers are tensile stress layers. When the semiconductor device is a PMOS, the first and the second strain layers are compression stress layers. Each of the tensile stress layers includes a first semiconductor compound epitaxy layer, and each of the compression stress layers includes a second semiconductor compound epitaxy layer. The first semiconductor compound epitaxy layers are SiC or SiC having N-type dopant. The second semiconductor compound epitaxy layer is SiGe or SiGe having P-type dopant.

According to an embodiment of the present invention, the said semiconductor device may also include two metal silicide layers completely covering the first source or drain region and the second source or drain region respectively.

The semiconductor device of the present invention renders the channel region of each of the transistors with an identical strain to enhance the reliability and performance of the device.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
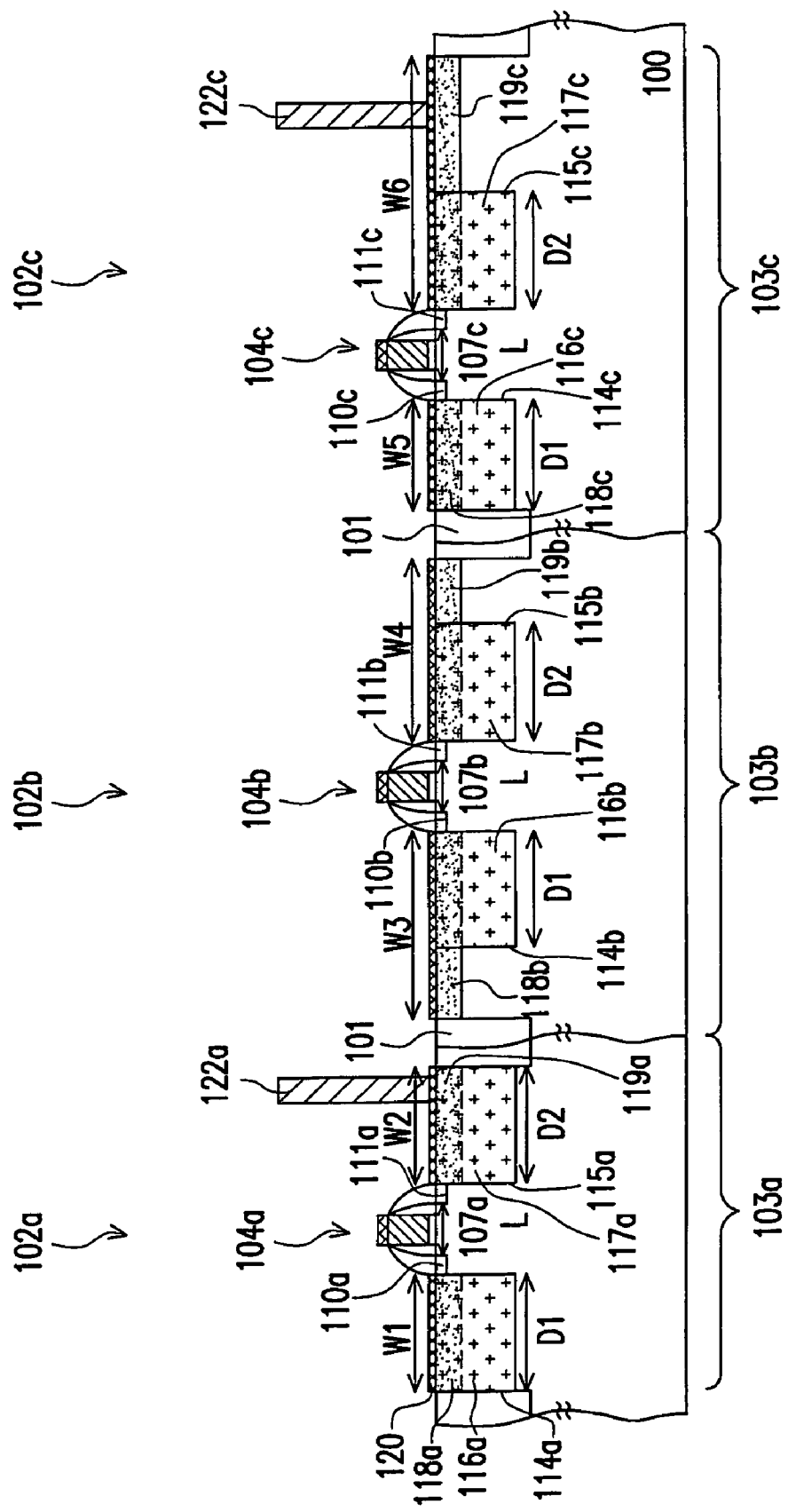
FIG. 1 is a schematic cross-sectional view illustrating a semiconductor device according to an embodiment of the present invention.

FIG. 1 is a schematic cross-sectional view illustrating a semiconductor device according to an embodiment of the present invention.

Referring to FIG. 1, the semiconductor device includes a plurality of transistors 102a, 102b and 102c having identical channel lengths and disposed on a substrate 100. The transistor 102a includes a gate structure 104a, a channel region 107a, source or drain extension regions 110a and 111a, strain layers 116a and 117a and source or drain regions 118a and 119a. The transistor 102b includes a gate structure 104b, a channel region 107b, source or drain extension regions 110b and 111b, strain layers 116b and 117b and source or drain regions 118b and 119b. The transistor 102c includes a gate structure 104c, a channel region 107c, source or drain extension regions 110c and 111c, strain layers 116c and 117c and source or drain regions 118c and 119c.

In the transistor 102a, the source or drain regions 118a and 119a are respectively disposed at two sides of the gate structure 104a in the substrate 100. The channel region 107a is disposed between the source or drain extension regions 110a and 111a in the substrate 100 below the gate structure 104a. The strain layers 116a and 117a are disposed at two sides of the gate structure 104a in the substrate 100 respectively. A portion of the strain layers 116a and 117a overlaps with the source or drain regions 118a and 119a. The transistors 102b and 102c are disposed in the same way as the transistor 102a and thus are not to be reiterated herein.

A material of the strain layer of the transistor is related to types of channel regions between the source or drain regions. When the transistors 102a, 102b and 102c are NMOS transistors, the strain layers 116a and 117a; 116b and 117b; 116c and 117c are tensile stress layers which increase a mobility rate of electrons. The tensile stress layer may be a semiconductor compound layer having a tensile stress, such as SiC or SiC having N-type dopant. When the transistors 102a, 102b and 102c are PMOS transistors, the strain layers 116a and 117a; 116b and 117b; 116c and 117c are compression stress layers which increase a mobility rate of holes. The compression stress layer may be a semiconductor compound layer having a compression stress, such as SiGe or SiGe having P-type dopant.

The channels 107a, 107b and 107c of the transistors 102a, 102b and 102c all have identical lengths L. The source or drain regions 118a and 119a; 118b and 119b; 118c and 119c have widths along a direction of the channel length L as W1 and W2; W3 and W4; and W5 and W6. Two source or drain regions of each of the transistors may have identical or different widths along the direction of the channel length L. The source or drain regions of different transistors may have identical or different widths along the direction of the channel length L.

In addition, the strain layers 116a, 116b and 116c of the transistors 102a, 102b and 102c all have identical widths D1 along the direction of the channel length L. D1 is smaller than or equal to a W1, a W3 and a W5. The strain layers 117a, 117b and 117c all have identical widths D2 along the direction of the channel length L. D2 is smaller than or equal to W2, W4 and W6.

In the transistor 102a of FIG. 1, the width W1 of the source or drain region 118a along the direction of the channel length L is equal to the width W2 of the source or drain region 119a along the direction of the channel length L. Furthermore, the width D1 of the strain layer 116a along the direction of the channel length L is equal to the width W1 of the source or drain region 118a along the direction of the channel length L. A width D2 of the strain layer 117a is equal to the width W2 of the source or drain region 118a.

In the transistor 102b, the width W3 of the source or drain region 118b along the direction of the channel length L is equal to the width W4 of the source or drain region 119b along the direction of the channel length L. W3 or W4 is larger than W1 or W2. The width D1 of the strain layer 116b along the direction of the channel length L is smaller than the width W3 of the source or drain region 118b along the direction of the channel length L. The width D2 of the strain layer 117b along the direction of the channel length L is smaller than the width W4 of the source or drain region 119b along the direction of the channel length L.

In the transistor 102c, the width W5 of the source or drain region 118c along the direction of the channel length L is smaller than the width W6 of the source or drain region 119c along the direction of the channel length L. The width D1 of the strain layer 116c along the direction of the channel length L is equal to the width W5 of the source or drain region 118c along the direction of the channel length L. The width D2 of the strain layer 117c along the direction of the channel length L is smaller than the width W6 of the source or drain region 119c along the direction of the channel length L.

According to an embodiment of the present invention, the width D1 of the strain layers 116a, 116b and 116c respectively along the direction of the channel length is equal to the width D2 (as illustrated in FIG. 1) of the strain layers 117a, 117b and 117c along the direction of the channel length L. In other words, all the strain layers 116a, 117a, 116b, 117b, 116c and 117c of the transistors 102a, 102b and 102c have identical widths along the direction of the channel length L.

According to another embodiment of the present invention, the respective width D1 of the strain layers 116a, 116b and 116c along the direction of the channel length L is not equal to the respective width D2 (not illustrated) of the strain layers 117a, 117b and 117c along the direction of the channel length L. Whether D1 is equal to D2 or D1 is not equal to D2, since the respective width of the strain layers 116a, 116b and 116c along the direction of the channel length L is D1 and the respective width of the strain layers 117a, 117b and 117c along the direction of the channel length L is D2, these strain layers can provide identical strains to the channels 107a, 107b and 107c of the transistors 102a, 102b and 102c respectively. Consequently, the transistors 102a, 102b and 102c have the same performance.

In brief, in a plurality of transistors having source or drain regions with identical channel lengths but different widths, the widths of the strain layers along the channel length direction are not necessarily equal to those of the source or drain regions along the channel length direction. In some transistors, the widths of the strain layers along the channel length direction may be equal to those of the source or drain regions along the channel length direction. In other transistors, the widths of the strain layers along the channel length direction may not be equal to those of the source or drain regions along the channel length direction. Two strain layers of each of the transistors may provide identical strains in the channel by controlling the widths of the strain layers in each of the transistors.

It should be noted that, in the present embodiment, when a transistor has the widths of the strain layers along the channel length direction being equal to those of the source or drain regions along the channel length direction, the projection areas projected on the substrate surface by the strain layers and the source or drain regions may be completely or partially overlapped with each other. After a metal silicide layer and a contact are subsequently formed, the metal silicide layer completely covers the source or drain region. The contact may be formed on the metal silicide layer having a strain layers, or on the metal silicide layer without a strain layer. A detailed description of the aforementioned is provided in the following.

Figure 2:
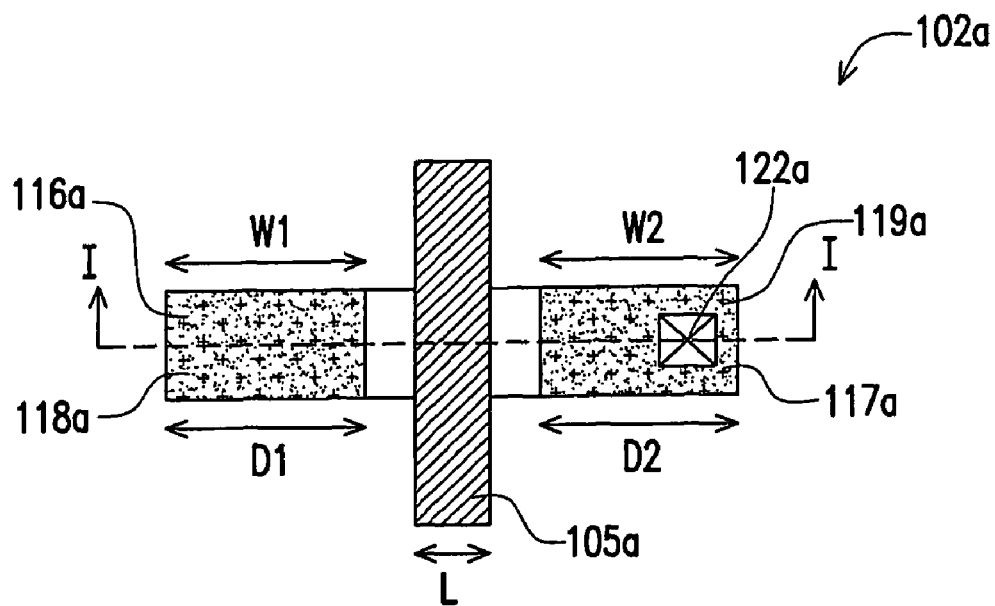
FIG. 2 is a top view of a transistor as illustrated in FIG. 1.

FIG. 2 is a top view of the transistor 102a in FIG. 1. The cross-sectional view along line I-I' of FIG. 2 is the transistor 102a as illustrated in FIG. 1. For clarity, an area of a metal silicide layer 120 is not illustrated in FIG. 2.

From FIGS. 2 and 1, it can be more clearly shown that projection areas of the strain layer 116a and the source or drain region 118a projected on a surface of the substrate 100 completely overlap with each other. Projection areas of the strain layer 117a and the source or drain region 119a projected on the surface of the substrate 100 completely overlap with each other. A contact 122a is disposed on a metal silicide layer 120 on the source or drain region 119a overlapped with the strain layer 117a.

Figure 3:
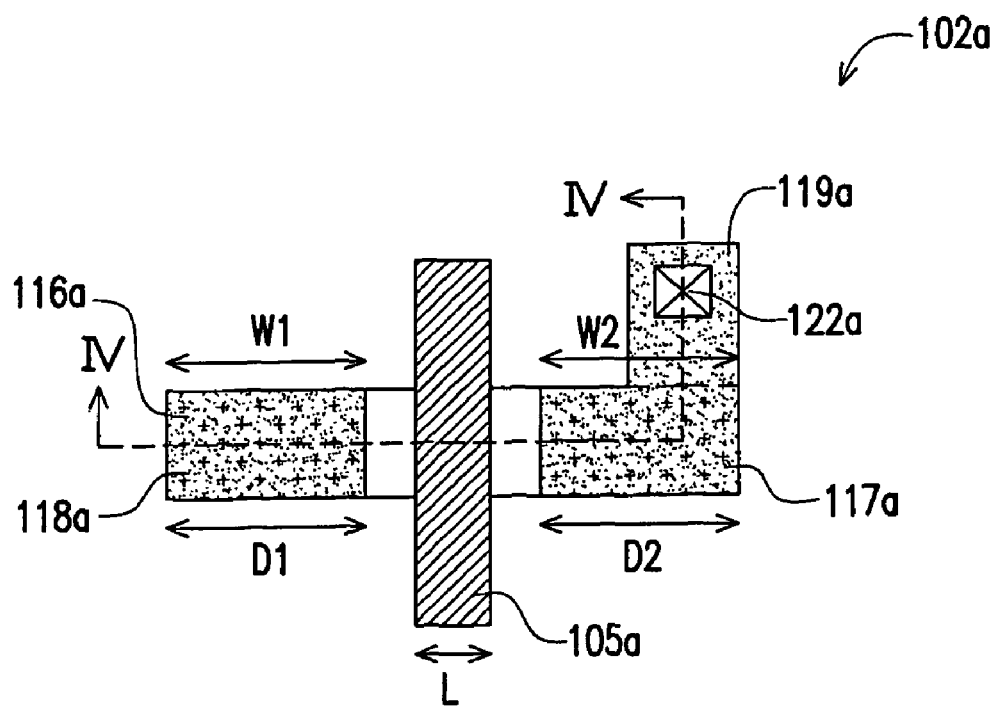
FIG. 3 is another top view of a transistor as illustrated in FIG. 1.
Figure 4:
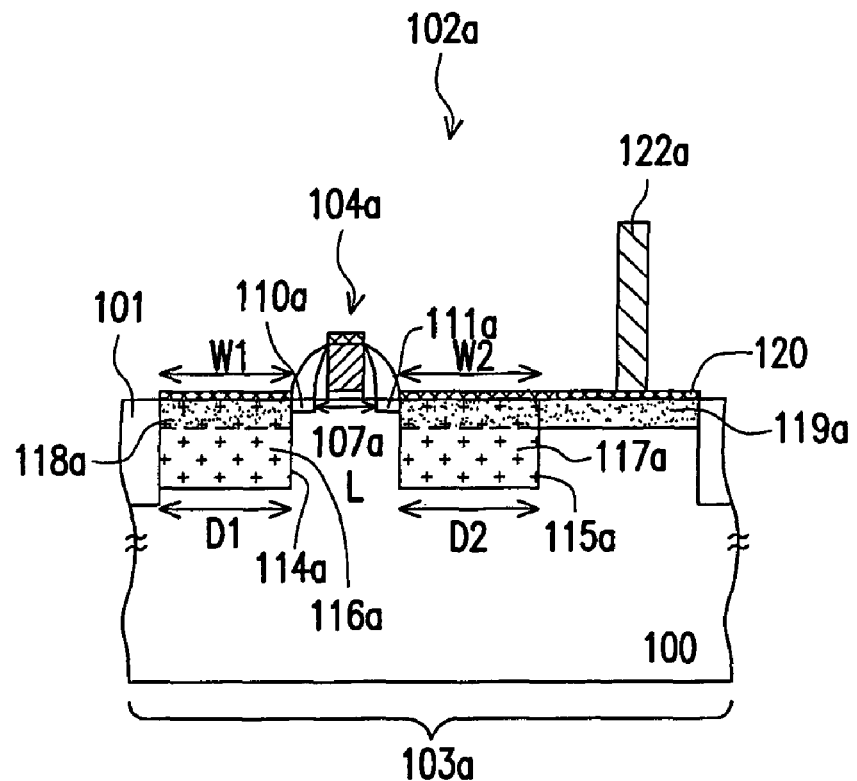
FIG. 4 is a schematic cross-sectional view along line IV-IV of FIG. 3.

In fact, the source or drain region 119a extends not only in the direction of the channel length L, but also in a direction perpendicular to the channel length L, as illustrated in FIG. 3. For clarity, an area of the metal silicide layer 120 is not illustrated in FIG. 3. The structural cross-sectional view along line IV-IV of FIG. 3 is shown in FIG. 4. From a top view of FIG. 3, it can be more clearly shown that projection areas of the strain layer 116a and the source or drain region 118a projected on the surface of the substrate 100 completely overlap with each other. Projection areas of the strain layer 117a and the source or drain region 119a projected on the surface of the substrate 100 partially overlap with each other. The projection area of the strain layer 117a is inside that of the source or drain region 119a.

In FIGS. 3 and 4, the source or drain regions 119a are distributed in an L shape. A portion of the source or drain region 119a extends in the direction of the channel length L and overlaps with the drain layer 117a. The other portion of the source or drain region 119a extends in the direction perpendicular to the channel length L. The contact 122a is disposed on the metal silicide layer 120 on the source or drain region 119a not overlapped with the strain layer 117a.

The embodiment of FIG. 3 is exemplified by the source or drain region 119a distributed in an L shape. However, the shape of the source or drain region 119a in the present invention is not limited thereto. The source or drain region 119a of the present invention may also include any portion extending beyond the direction of the channel length L, for example, in an angle of 45 degrees.

Figure 5:
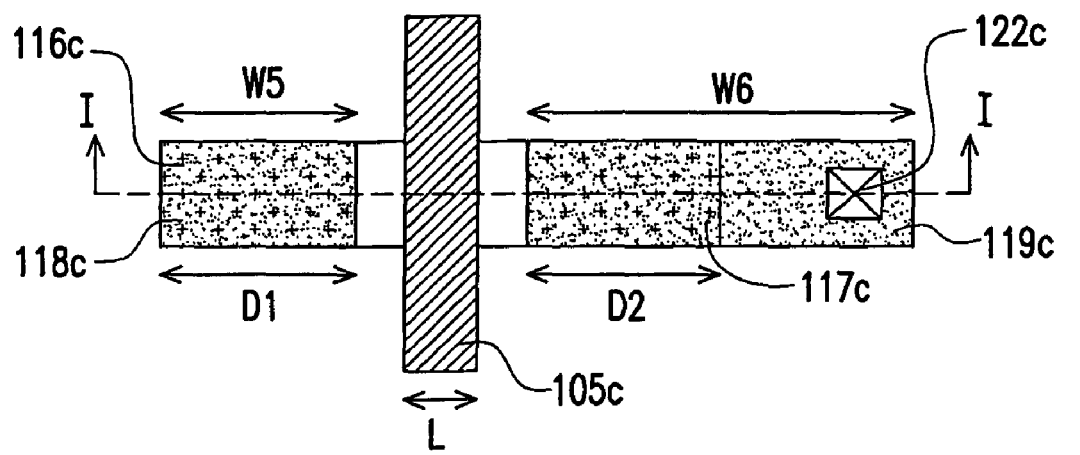
FIG. 5 is a top view of another transistor as illustrated in FIG. 1.

FIG. 5 is a top view of the transistor 102c in FIG. 1. Alternatively speaking, the cross-sectional schematic view along line I-I' in FIG. 5 is a the schematic view of the transistor 102c as illustrated in FIG. 1. For clarity, the area of the metal silicide layer 120 is not illustrated in FIG. 5.

From a top view of FIG. 5, it can be more clearly shown that projection areas of the strain layer 116c and the source or drain region 118c projected on the surface of the substrate 100 completely overlap with each other. Projection areas of the strain layer 117c and the source or drain region 119c projected on the surface of the substrate 100 partially overlap with each other. The projection area of the strain layer 117c is inside that of the source or drain region 119c.

In the embodiment of FIG. 5, the source or drain region 119c is distributed in a long strip shape and extends in the direction of the channel length L. A portion of the source or drain region 119c overlaps with the drain layer 117c. A contact 122c is disposed on the metal silicide layer 120 on the source or drain region 119c not overlapped with the strain layer 117c.

It should be noted that the spirit of the present invention lies in that the channel regions of the semiconductor have identical strains without affecting the operation of the semiconductor device so as to enhance the performance and the reliability of the semiconductor device. Hence, the pattern of the source or drain regions and the metal silicide layers in the semiconductor may vary to suit different design requirements. For example, the source or drain regions of the said transistors extend not only in the channel length direction but further in other directions. However, the widths of the strain layers along the channel length direction are identical.

Figure 6A:
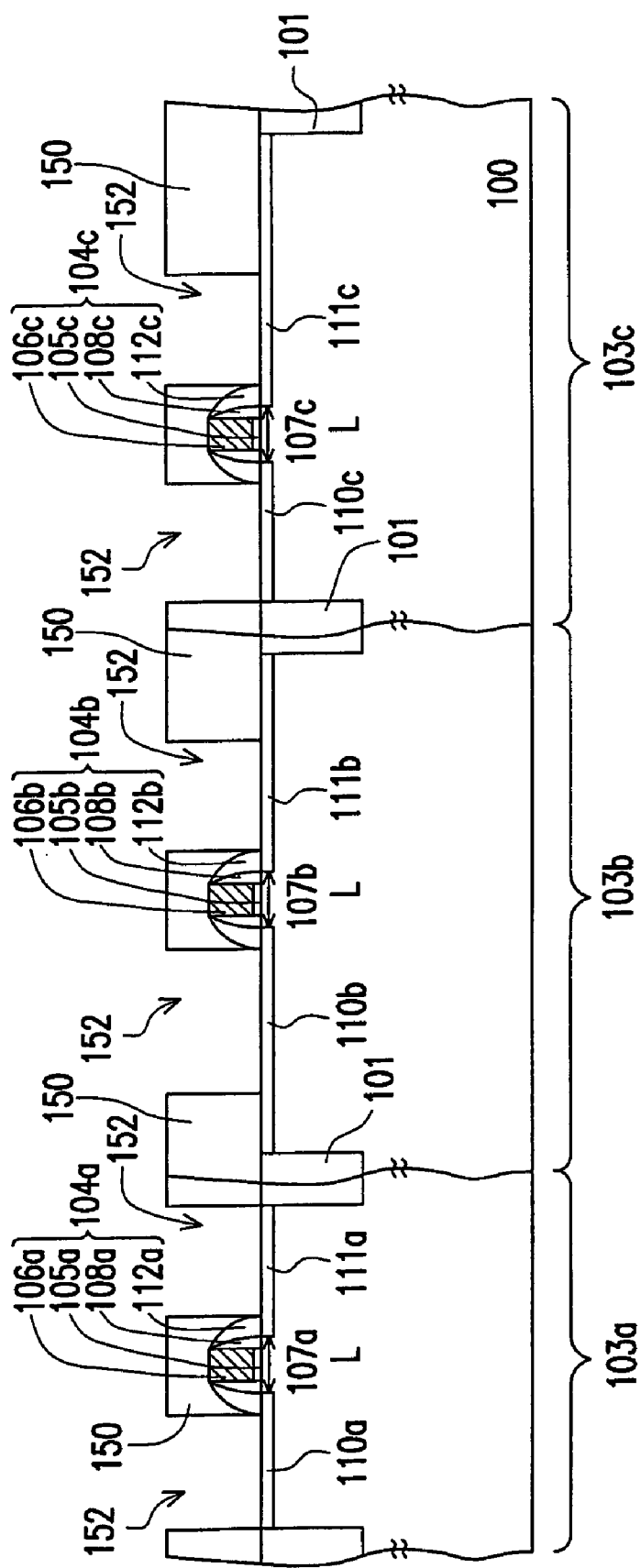
FIGS. 6A and 6C are schematic cross-sectional views illustrating a process of fabricating the semiconductor device according to an embodiment of the present invention.
Figure 6B:
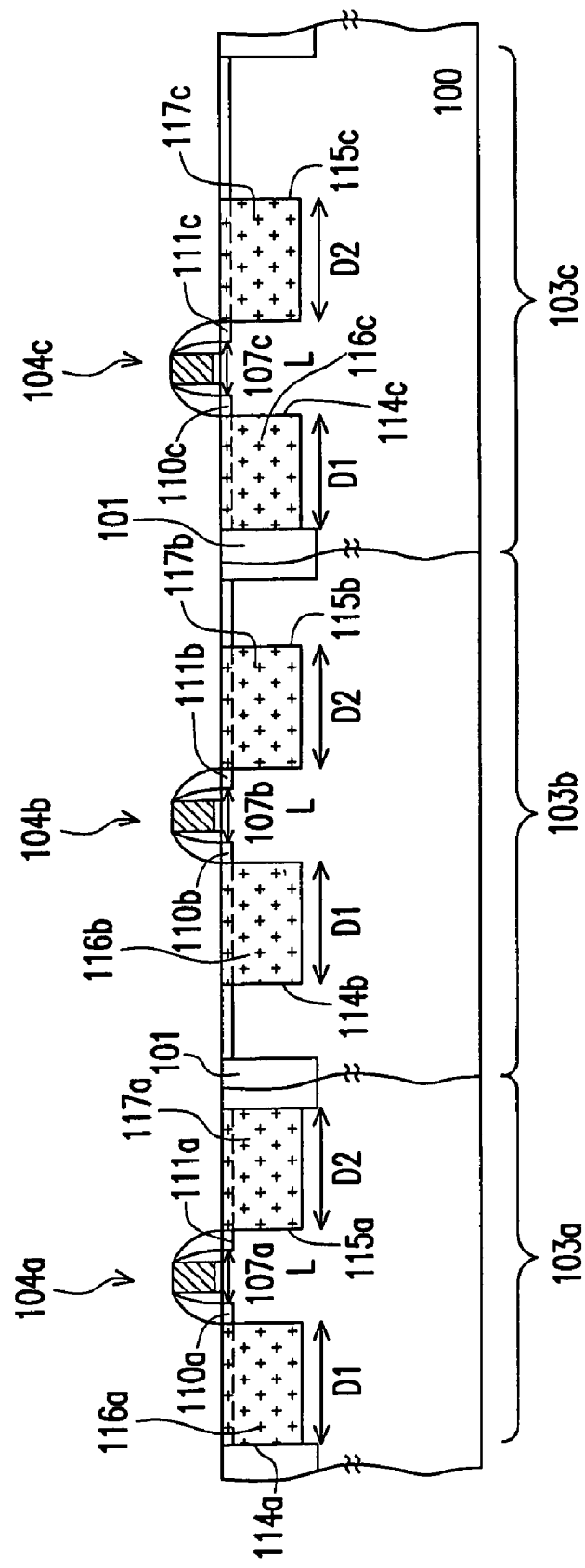
Figure 6C:
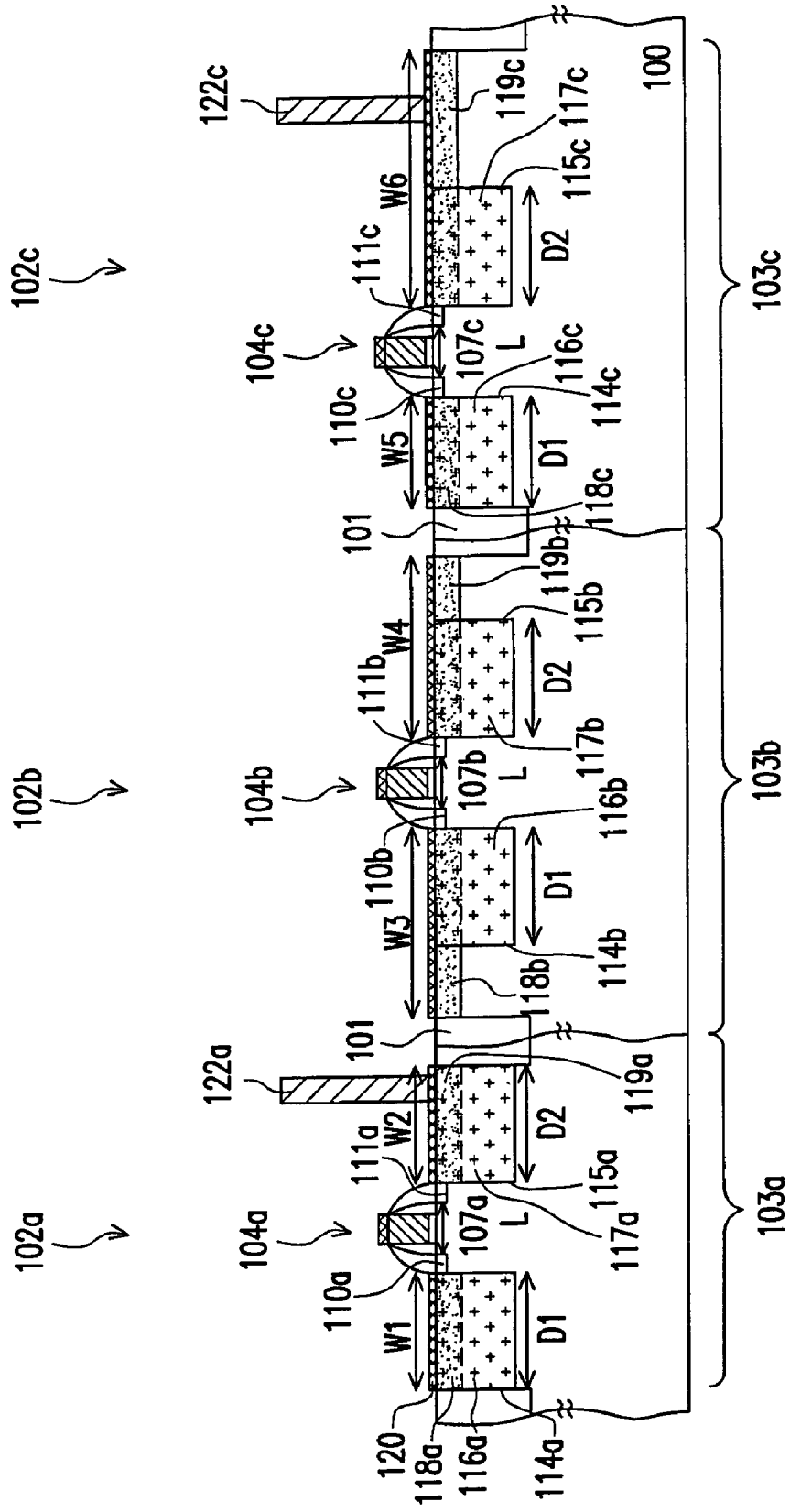

A method of fabricating the semiconductor device of the present invention is explained hereinafter. FIGS. 6A-6C are schematic cross-sectional views illustrating a process of fabricating a semiconductor device according to an embodiment of the present invention.

Referring to FIG. 6A, first a substrate 100 is provided. An isolation structure 101 has already been formed in the substrate 100 and active regions 103a, 103b and 103c are defined. A method of forming the isolation structure 101 is, for example, a conventional shallow trench isolation (STI) process or a local oxidation process (LOCOS). First, gate dielectric layers 105a, 105b and 105c and gates 106a, 106b and 106c are formed on the active regions 103a, 103b and 103c respectively. A forming method is, for example, first forming a gate dielectric layer (not illustrated) and a gate material layer (not illustrated) sequentially on the substrate 100. Afterwards, the gate dielectric layer and the gate material layer are patterned. A material of the gate dielectric layer is silicon oxide, for example. A material of the gate material layer is, for example, polysilicon or metal. Thereafter, off-set spacers 108a, 108b and 108c may be optionally formed on sidewalls of the gates 106a, 106b and 106c respectively. A material of the off-set spacer 108a is silicon oxide or other suitable materials, for example. A method of forming the off-set spacer 108a is, for example, first forming a layer of spacer material (not illustrated) by a thermal oxidation process on the gate 106a and then removing a portion of the spacer material by an anisotropic etching process. The forming method and material of the off-set spacers 108b and 108c are the same as those of the off-set spacer 108a and are therefore not to be reiterated herein.

Then, source or drain extension regions 110a and 111a; 110b and 111b; 110c and 111c are formed at two sides of the gates 106a, 106b and 106c respectively in the substrate 100. The forming method and dopant of the source or drain extension regions 110b and 111b; 110c and 111c are the same as those of the source or drain extension regions 110a and 111a. Hence, only the forming method of the source or drain extension regions 110a and 111a is described herein to exemplify. A method of forming the source or drain extension regions 110a and 111a is, for example, performing an ion implantation process using the gate 106a and the off-set spacer 108a as masks. When fabricating an NMOS transistor, ions utilized are N-type dopant such as phosphorous ions or arsenic ions. When fabricating a PMOS transistor, the ions utilized are P-type dopant such as boron ions or boron fluoride ions.

In the meantime of forming the source or drain extension regions, a channel region is formed between the source or drain extension regions respectively. A channel region 107a is disposed between the source or drain extension regions 110a and 111a. A channel region 107b is disposed between the source or drain extension regions 110b and 111b. A channel region 107c is disposed between the source or drain extension regions 110c and 111c. According to the present embodiment of the present invention, the channel regions 107a, 107b and 107c all have identical channel lengths L.

Afterwards, referring to FIG. 6A, spacers 112a, 112b and 112c are formed on sidewalls of the off-set spacers 108a, 108b and 108c respectively. A method of forming the spacers 112a, 112b and 112c is, for example, first forming a spacer material layer (not illustrated) on the surface of the substrate 100 by a chemical vapor deposition (CVD) process and then removing a portion of the spacer material layer by an anisotropic etching process. A material of the spacer material layer is silicon oxide, silicon nitride or silicon oxynitride, for example. The spacers 112a, 112b and 112c may have different structures, such as a single-layered structure or a multilayer structure. In the drawings, only a single layer is illustrated to represent the structure of the spacer. The gate dielectric layer 105a, the gate 106a, the off-set spacer 108a and the spacer 112a constitute a gate structure 104a. The gate dielectric layer 105b, the gate 106b, the off-set spacer 108b and the spacer 112b constitute the gate structure 104b. The gate dielectric layer 105c, the gate 106c, the off-set spacer 108c and the spacer 112c constitute a gate structure 104c.

Afterwards, referring to FIG. 6B, strain layers 116a and 117a; 116b and 117b; 116c and 117c are formed at two sides of the spacers 112a, 112b and 112c in the substrate 100 respectively. According to an embodiment of the present invention, a strain layer is formed by a selective area epitaxy growth (SEG) process. First, recesses 114a and 115a; 114b and 115b; and 114c and 115c are formed at two sides of the spacers 112a, 112b and 112c in the substrate 100 respectively. A method of forming the recesses 114b and 115b; 114c and 115c is similar to that of the recesses 114a and 115a. Hence, only the forming method of the recesses 114a and 115a is described to exemplify herein. A method of forming the recesses 114a and 115a is, for example, forming a patterned photoresist layer 150 (referring to FIG. 6A) on the substrate 100 first. An opening 152 of the patterned photoresist layer 150 exposes the substrate 100 at two the sides of the spacer 112a, which is an area predetermined for the recesses 114a and 115a to be formed in. Later, the patterned photoresist layer 150 is utilized as a mask to perform an etching process so as to remove a portion of the substrate 100. The etching process may be an isotropic, anisotropic or tapered etching process. Afterwards, the patterned photoresist layer 150 is further removed.

Then, the strain layers 116a and 117a; 116b and 117b; 116c and 117c are formed on the substrate 100 of bottoms of the recesses 114a and 115a; 114b and 115b; and 114c and 115c respectively. Forming methods and materials of these strain layers are similar, and thus only the forming method of the strain layers 116a and 117a is described to exemplify herein. The method of forming the strain layers 116a and 117a is, for example, is a selective area epitaxy growth (SEG) process. When fabricating an NMOS transistor, the strain layers 116a and 117a are, for example, semiconductor compounds which generate a tensile stress, such as SiC or SiC having N-type dopant. When fabricating a PMOS transistor, the strain layers 116a and 117a are, for example, semiconductor compounds which generate a compression stress, such as SiGe or SiGe having N-type dopant.

According to another embodiment of the present invention, besides utilizing a selective area epitaxy growth (SEG) process to form the strain layers, these strain layers may also be formed by a solid phase epitaxy (SPE) process. A detailed description thereof is provided in the following.

Referring again to FIGS. 6A and 6B, after the patterned photoresist layer 150 of FIG. 6A is formed, a strain atom implantation process is performed first and then a solid phase epitaxy (SPE) anneal process is implemented. Consequently, the implanted strain atoms grow into the strain layers 116a, 117a, 116b, 117b, 116c and 117c. When fabricating an NMOS transistor, the implanted strain atoms are, for example, carbon. The strain layers 116a, 117a, 116b, 117b, 116c and 117c are SiC layers which generate a tensile stress, for example. When fabricating a PMOS transistor, the implanted strain atoms are, for example, geranium. The strain layers 116a, 117a, 116b, 117b, 116c and 117c are SiGe layers which generate a compression stress, for example.

Thereafter, referring to FIG. 6C, the source or drain regions 118a and 119a; 118b and 119b; and 118c and 119c are formed at two sides of the gate structures 104a, 104b and 104c in the substrate 100 respectively. The forming method and dopant of the source or drain regions 118b and 119b; and 118c and 119c are similar to those of the source or drain regions 118a and 119a. Hence, only the forming method of the source or drain regions 118a and 119a is described herein to exemplify. The method of forming the source or drain region 118a and 119a is, for example, using the spacer 112a and the gate structure 104a as masks to perform an ion implantation process. When fabricating an NMOS transistor, ions utilized are N-type dopant such as phosphorous ions or arsenic ions. When fabricating a PMOS transistor, the ions utilized are P-type dopant such as boron ions or boron fluoride ions.

Next, still referring to FIG. 1, the metal silicide layer 120 is formed on the source or drain regions 118a and 119a; 118b and 119b; 118c and 119c and the gates 106a, 106b and 106c. A material of the metal silicide layer 120 may be tungsten silicide, titanium silicide, cobalt silicide, molybdenum silicide, nickel silicide, palladium silicide or platinum silicide, for example. The metal silicide 120 may be formed, for example, by a self-aligned metal silicidation process. Up to this step, the process of fabricating the transistors 102a, 102b and 102c has been completed. Subsequent process is well-known to persons killed in the art, such as forming a contact etching stopper layer (CESL) on the surface of the substrate 100 and forming the contacts 122a and 122c on the source or drain regions 119a and 19c, and therefore is not to be reiterated herein.

According to the present embodiment of the present invention, the source or drain regions 118a and 119a; 118b and 119b; and 118c and 119c of different transistors 102a, 102b and 102c respectively have different widths W1 and W2; W3 and W4; and W5 and W6 along the direction of the channel length L. However, the strain regions 116a, 116b and 116c all have identical widths D1 along the direction of the channel length L, and the strain layers 117a, 117b and 117c all have identical widths D2 along the direction of the channel length L. Therefore, these strain layers can provide the same strains to the channels 107a, 107b and 107c of the transistors 102a, 102b and 102c. Consequently, different transistors may have source or drain regions with different widths but identical strains according to various design requirements so that the difficulty of operating the semiconductor device is reduced and the performance and the reliability of the semiconductor device is enhanced.

The semiconductor device provided in the present invention not only provides an identical strain to the channel region of each of the transistors, but also avoids an loading effect during an etching process simultaneously.

In summary, the semiconductor device of the present invention allows each of the transistors to have the same strain so as to enhance the performance and the reliability of the semiconductor device. In another aspect, the present invention avoids the loading effect and problems derived therefrom during the etching process in the prior art.

Although the present invention has been disclosed above by the embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A semiconductor device, comprising:
two transistors, each of the two transistors comprising a first source or drain region and a second source or drain region disposed on a substrate, and a gate structure disposed on a channel region between the first source or drain region and the second source or drain region, wherein the channel regions of the two transistors have identical lengths, and the first source or drain region and the second source or drain region of the same transistor are different in width along a channel length direction;
two strain layers, each of the two strain layers comprising a first strain layer and a second strain layer embedded at two sides of the gate structure of each of the two transistors in the substrate respectively, wherein the first strain layer and the second strain layer are either completely or partially overlapped with and covered by the first source or drain region and the second source or drain region respectively, and the first strain layers have an identical first width along the channel length direction, and the second strain layers have an identical second width along the channel length direction; and
a contact, disposed above the second source or drain region of each of the two transistors not overlapped with the second strain layer.

2. The semiconductor device as claimed in claim 1, wherein the first width is equal to the second width.

3. The semiconductor device as claimed in claim 1, wherein the first widths are not equal to the second widths.

4. The semiconductor device as claimed in claim 1, wherein when the transistors are N-type channel metal oxide semiconductor (NMOS), the strain layers are tensile stress layers; when the transistors are P-type channel metal oxide semiconductors (PMOS), the strain layers are compression stress layers.

5. The semiconductor device as claimed in claim 4, wherein each of the tensile stress layers comprises a first semiconductor compound epitaxy layer, and each of the compression stress layers comprises a second semiconductor compound epitaxy layer.

6. The semiconductor device as claimed in claim 5, wherein the first semiconductor compound epitaxy layers are SiC or SiC having N-type dopant, and the second semiconductor compound epitaxy layers are SiGe or SiGe having P-type dopant.

7. The semiconductor device as claimed in claim 1, wherein one of the two strain layers has a width along the channel length direction smaller than the width of one of the two source or drain regions along the channel length direction.

8. The semiconductor device as claimed in claim 1, wherein in the transistors, first source or drain regions have identical third widths along the channel length direction.

9. The semiconductor device as claimed in claim 8, wherein in the transistors, second source or drain regions have identical fourth widths along the channel length direction, but the fourth widths are not equal to the third widths.

10. A semiconductor device, comprising:
a first source or drain region and a second source or drain region, respectively disposed in a substrate, a channel region disposed between the first source or drain region and the second source or drain region, a channel length direction of the channel region being a first direction;
a gate structure, disposed on the channel region; and
a first and a second strain layers, embedded at two sides of the gate structure in the substrate, wherein the first strain layer is completely overlapped with and covered by the first source or drain region, the second strain layer is partially overlapped with and covered by the second source or drain region, projection areas projected on a surface of the substrate by the second strain layer and the second source or drain region partially overlap with each other, and the projection area of the second strain layer is inside that of the second source or drain region; and a contact, disposed above the second source or drain region not overlapped with the second strain layer.

11. The semiconductor device as claimed in claim 10, wherein the first source or drain region and the second source or drain region have widths in the first direction, and the second source or drain region further extends beyond the first direction.

12. The semiconductor device as claimed in claim 11, wherein the first and the second strain layers have identical widths along the first direction.

13. The semiconductor device as claimed in claim 10, wherein the second source or drain region has a width along the first direction larger than a width of the first source or drain region along the first direction.

14. The semiconductor device as claimed in claim 13, wherein the second strain layer has a width along the first direction smaller than the width of the second source or drain region along the first direction.

15. The semiconductor device as claimed in claim 14, wherein the first and the second strain layers have identical widths along the first direction.

16. The semiconductor device as claimed in claim 10, wherein when the semiconductor device is an NMOS, the first and the second strain layers are tensile stress layers; when the semiconductor device is a PMOS, the first and the second strain layers are compression stress layers.

17. The semiconductor device as claimed in claim 16, wherein each of the tensile stress layers comprises a first semiconductor compound epitaxy layer, and each of the compression stress layers comprises a second semiconductor compound epitaxy layer.

18. The semiconductor device as claimed in claim 17, wherein the first semiconductor compound epitaxy layers are SiC or SiC having N-type dopant; the second semiconductor compound epitaxy layers are SiGe or SiGe having P-type dopant.

19. The semiconductor device as claimed in claim 10, further comprising two metal silicide layers completely covering the first source or drain region and the second source or drain region respectively.

20. A semiconductor device, comprising:
a substrate; and
a transistor disposed on the substrate, the transistor comprising:
a first source or drain region and a second source or drain region disposed in the substrate;
a channel region between the first source or drain region and the second source or drain region;
a gate structure disposed on the channel region; and
a strain layer comprising a first strain layer and a second strain layer, the strain layer being embedded in the substrate and located on the first source or drain region and the second source or drain region respectively; and
a contact, disposed above the second source or drain region not overlapped with the second strain layer;
wherein the first source or drain region is asymmetric to the second source or drain region, the first strain layer is symmetric to the second strain layer.

* * * * *